US012812981B2

(12) United States Patent
Liu

(10) Patent No.: US 12,812,981 B2
(45) Date of Patent: Nov. 24, 2026

(54) SEMICONDUCTOR DEVICE WITH ELECTROSTATIC DISCHARGE PROTECTION

(71) Applicant: Avago Technologies International Sales Pte. Limited, Singapore (SG)

(72) Inventor: Qing Liu, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 508 days.

(21) Appl. No.: 18/357,899

(22) Filed: Jul. 24, 2023

(65) Prior Publication Data

US 2025/0040256 A1 Jan. 30, 2025

(51) Int. Cl.
*H10D 89/60* (2025.01)

(52) U.S. Cl.
CPC .................................. *H10D 89/814* (2025.01)

(58) Field of Classification Search
CPC .. H10D 89/814; H10D 89/811; H10D 30/658; H10D 30/6211; H10D 62/116; H10D 62/157; H10D 64/112; H01L 23/60
See application file for complete search history.

(56) References Cited

U.S. PATENT DOCUMENTS 7,087,973 B2 8/2006 Mallikarjunaswamy et al.
7,671,423 B2 3/2010 Voldman
10,262,994 B2 * 4/2019 Liu .................... H10D 30/0285
11,658,480 B2 * 5/2023 Nath ...................... H02H 9/046 361/56
2015/0357462 A1 12/2015 Ponoth et al.
2016/0268800 A1 * 9/2016 Kushner .............. H10D 89/811
2016/0372593 A1 * 12/2016 Yoo .................... H10D 30/0221
2019/0131402 A1 * 5/2019 Liu ...................... H10D 30/024
2019/0333995 A1 10/2019 Liu et al.
2019/0371886 A1 * 12/2019 Radosavljevic ..... H10D 30/015
2020/0111780 A1 * 4/2020 Liu ........................ H10D 30/62
2021/0135006 A1 5/2021 Liu
2021/0202385 A1 7/2021 Huang et al.
2021/0280427 A1 9/2021 Wang et al.
(Continued)

FOREIGN PATENT DOCUMENTS

CN 114914304 A 8/2022
TW I385786 B 2/2013

OTHER PUBLICATIONS

Lee et al., "Novel ESD Protection Structure with Embedded SCR LDMOS for Smart Power Technology," (2002), 6 pages.
(Continued)

*Primary Examiner* — Fernando L Toledo
*Assistant Examiner* — Marshall Mu-Nuo Hatfield
(74) *Attorney, Agent, or Firm* — Quarles & Brady LLP

(57) ABSTRACT

A semiconductor device, such as a fin field-effect transistor (FinFET), that can provide advantages in terms of electrostatic discharge protection. The semiconductor device includes a fin with an undoped region, a first doped region, a second doped region, and a third doped region positioned between the first doped region and the second doped region. The semiconductor device further includes a gate disposed on the undoped region of the fin, a silicide layer disposed on the third doped region, and an interconnect disposed on the silicide layer to form a drain.

18 Claims, 3 Drawing Sheets

(56) References Cited

U.S. PATENT DOCUMENTS

| | | | | |
|---|---|---|---|---|
| 2023/0171417 | A1* | 6/2023 | Atkins | H04N 19/31 |
| 2023/0197731 | A1* | 6/2023 | Herrmann | H10D 30/0275 257/347 |

OTHER PUBLICATIONS

Chatterjee et al., "An Insight Into the ESD Behavior of the Nanometer-Scale Drain-Extended NMOS Device—Part I: Turn-On Behavior of the Parasitic Bipolar," (2011), 9 pages.
Song et al., "Improved LDMOS-SCR for high-voltage electrostatic discharge (ESD) protection applications," (2020), 2 pages.
Lijuan, et al., "Impact of parasitic resistance on the ESD robustness of high-voltage devices," (2012), 5 pages.
European Patent Office, Extended Search Report, Application No. 24190447.3, Dec. 17, 2024, 10 pages.

* cited by examiner

SEMICONDUCTOR DEVICE WITH ELECTROSTATIC DISCHARGE PROTECTION

BACKGROUND

The present disclosure relates, in general, to semiconductor technology. More particularly, the present disclosure relates to semiconductor device structures that can be used to provide electrostatic discharge (ESD) protection. Semiconductor device structures including fin field-effect transistors (FinFET) and, more specifically, including laterally diffused metal-oxide-semiconductors (LDMOS), can be used in high-power applications such as power amplifiers, radio frequency (RF) amplifiers, and power transistors for radio and wireless communication systems. As the demand for high-power applications increases, research and development efforts continue to advance semiconductor technologies to meet manufacturing capabilities and capacities of foundries and enhance the functionality of various electronic devices and circuits.

DETAILED DESCRIPTION

Figure 1:
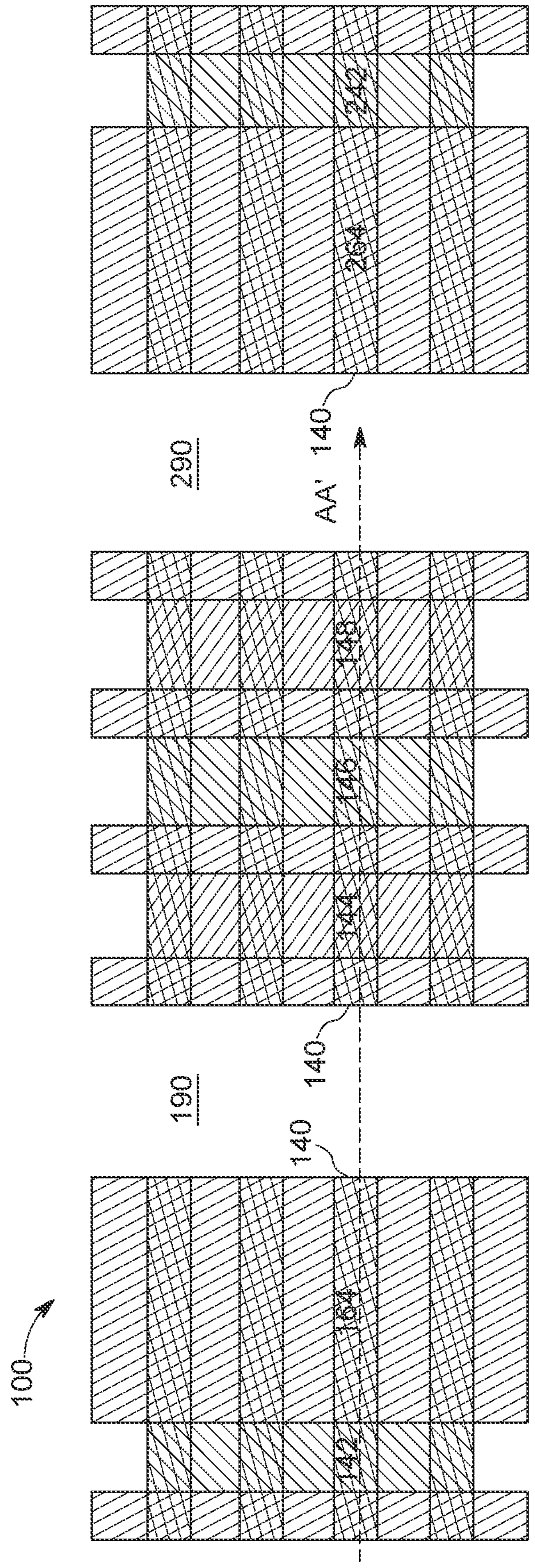
FIG. 1 shows a top view of an example semiconductor device, in accordance with some aspects of the disclosure.

In the following description, for the purposes of explanation, numerous details are set forth to provide a thorough understanding of the disclosure. It will be apparent to one skilled in the art, however, that other aspects can be practiced without some details. Different examples are described herein, and while various features are ascribed to the examples, it should be appreciated that the features described with respect to one example may be incorporated with other examples as well. By the same token, however, no single feature or features of any described example should be considered essential to every example, as other examples may omit such features.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Likewise, when an element is referred to herein as being a "layer", it is to be understood that the layer can be a single layer or include multiple layers. For example, a conductive layer can include multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, unless otherwise indicated, all numbers used herein to express quantities, dimensions, and so forth should be understood as being modified in all instances by the term "about". In this application, the use of the singular includes the plural unless specifically stated otherwise, and use of the terms "and" and "or" means "and/or" unless otherwise indicated. Moreover, the use of the terms "including" and "having", as well as other forms, such as "includes", "included", "has", "have", and "had", should be considered non-exclusive. Also, terms such as "element" or "component" encompass both elements and components comprising one unit and elements and components that comprise more than one unit, unless specifically stated otherwise.

While some features and aspects have been described with respect to the examples, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various implementations. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various examples are described with or without some features for ease of description and to illustrate aspects of those embodiments, the various components and/or features described herein with respect to a particular example can be substituted, added and/or subtracted from among other described embodiments, unless the context dictates otherwise. Consequently, although several examples are described above, it will be appreciated that the disclosure is intended to cover all modifications and equivalents within the scope of the following claims.

Referring to FIG. 1, a top view illustrating an example semiconductor device 100 is shown, in accordance with some aspects of the disclosure. The semiconductor device 100 can be implemented as a variety of types of semiconductor devices, such as various different types and combinations of transistor structures. For example, the semiconductor device 100 can be a non-planar (three-dimensional) FinFET device such as an LDMOS device. As shown in FIG. 1, the semiconductor device 100 includes a plurality of fins (channels), including a fin 140. The term "fin" as used herein refers to any conductive fin or other channel-type structure used in the semiconductor device 100, as will be appreciated by the skilled person, and should not unduly limit the scope of the claims. The different fins of the semiconductor device 100 can be formed using any suitable materials (e.g., silicon) and can be disposed in generally parallel relation to each other. The fin 140 is shown to include various doped regions, including a doped region 142, a doped region 144, a doped region 146, a doped region 148, and a doped region 242. The semiconductor device 100 is also shown to include a gate 164 and a gate 264, as well as a trench 190 and a trench 290.

The trench 190 can be disposed between the gate 164 and the doped region 144, and the trench 290 can be disposed between the doped region 148 and the gate 264. Accordingly, the trench 190 can also be disposed between the doped region 142 and the doped region 144. The trench 190 and the trench 290 can be formed using any suitable lithography and etching techniques. The specific locations of the trench 190 and the trench 290 can provide advantages in terms of various electrical properties of the semiconductor device 100 (e.g., preventing current leakage, etc.). The gate 264 can be a gate for a second transistor separate from a transistor associated with the gate 164. As detailed below, because of the drain terminal design of the semiconductor device 100, advantages in terms of electrostatic discharge prevention can be provided. From the top view shown in FIG. 1, it can be seen that the doped region 146 is disposed between the doped region 144 and the doped region 148.

Figure 2:
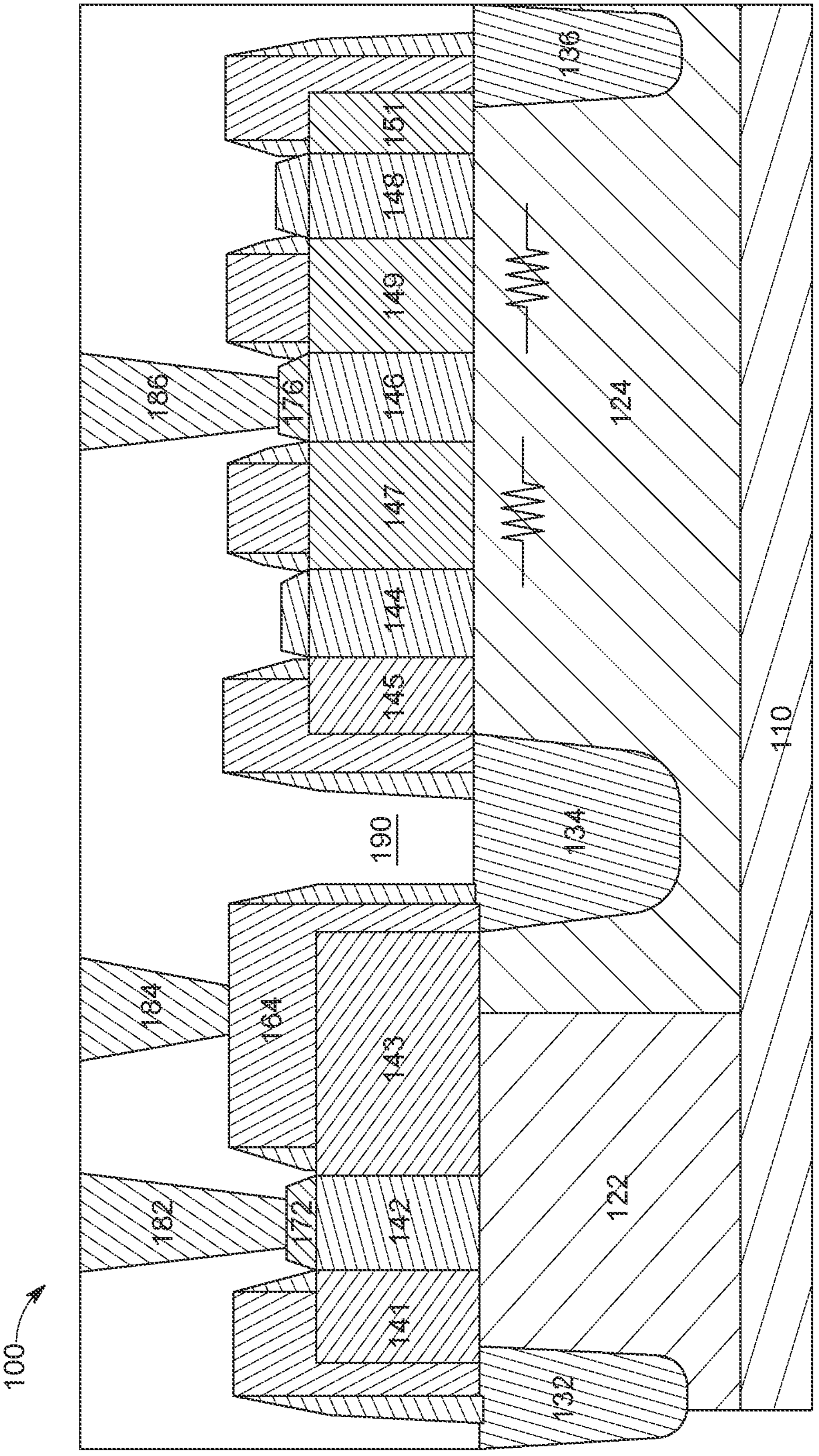
FIG. 2 shows a cross section illustrating the example semiconductor device of FIG. 1, in accordance with some aspects of the disclosure.

Referring to FIG. 2, a cross section taken from the line AA' in FIG. 1 illustrating parts of the semiconductor device 100 in more detail is shown, in accordance with some aspects of the disclosure. From the cross section shown in FIG. 2, different components of the semiconductor device 100 visible in FIG. 1 can again be seen, including the gate 164, the trench 190, the doped region 142, the doped region 144, the doped region 146, the doped region 148. Also visible in FIG. 2 are additional components of the semiconductor device 100, including a substrate 110, a well 122, a well 124, a shallow trench isolation (STI) 132, a shallow trench isolation 134, and a shallow trench isolation 136. FIG. 2 also shows various undoped regions of the fin 140, including an undoped region 141, an undoped region 143, an undoped region 145, an undoped region 147, an undoped region 149, and an undoped region 151. FIG. 2 further shows a silicide layer 172 and a silicide layer 176, as well as an interconnect 182, an interconnect 184, and an interconnect 186.

The substrate 110 can be formed of silicon material (e.g., crystalline silicon) and/or other suitable materials or combinations of materials. Substrate 110 can be implemented using various fabrication technologies, such as using a silicon-on-insulator (SOI) structure, a bulk semiconductor structure, an alloy semiconductor, a compound semiconductor, germanium, and/or various other suitable materials and combinations thereof. The substrate 110 generally provides a base for forming components of the semiconductor device 100 thereon. It will be appreciated that the semiconductor device 100 can be implemented in a variety of different types of circuits, inducing various types of integrated circuit (IC) chips.

The well 122 can be implemented as a p-type well and the well 124 can be implemented as an n-type well, in some examples. That is, the well 122 can be doped using p-type dopants such as boron and/or other similar p-type dopants, whereas the well 124 can be doped using n-type dopants such as arsenic, phosphorous, and/or other similar dopants. The well 122 and the well 124 can be regions of the substrate 110 such that the well 122 and the well 124 are formed as doped silicon material. The well 122 and the well 124 can also be formed at least partially separate from the substrate 110, for example at least partially within various types of oxide layers and/or other insulating/dielectric layers. Notably, as shown in FIG. 2, the doped region 144, the undoped region 147, the doped region 146, the undoped region 149, and the doped region 148 of the fin 140 can be disposed on the well 124. Since the well 124 can be an n-type well, this structure provides an intrinsic ballast resistor at the drain of the semiconductor device 100, as detailed further below. Also, the doped region 142 can be disposed on the well 122, as shown in FIG. 2.

The shallow trench isolation 132, the shallow trench isolation 134, and the shallow trench isolation 136 can be formed as a result of etching trenches in the semiconductor device 100. For example, after etching the trench 190, the shallow trench isolation 134 can be formed by depositing a dielectric material at least partially within the trench 190. The shallow trench isolation 132 and the shallow trench isolation 136 can be formed in a similar manner. The dielectric material used to form the shallow trench isolation 132, the shallow trench isolation 134, and the shallow trench isolation 136 can be, for example, silicon oxide, silicon nitride, and/or other suitable materials and combinations of materials. The shallow trench isolation 132, the shallow trench isolation 134, and the shallow trench isolation 136 can generally prevent leakage of electric current between different components of the semiconductor device 100.

The gate 164 can be formed using polysilicon material and/or another suitable material or combination of materials (e.g., a metal gate). Voltage applied at the gate 164 can generally control the operation and conductance of the semiconductor device 100. As shown in FIG. 2, spacers can be formed at least partially around the gate 164 to electrically isolate the gate 164 and prevent charge leakage. The spacers can be formed using materials with high dielectric constants such as silicon nitride, silicon oxide, and/or other suitable materials and combinations thereof. Additionally, a gate oxide layer can be formed (e.g., using thermal oxidation) between the gate 164 and the fin 140 using materials such as silicon nitride, aluminum oxide, silicon dioxide, and/or other suitable materials and combinations thereof. In some examples, a silicide layer similar to the silicide layer

172 and the silicide layer 176 described below can be formed on the gate 164 (e.g., using a trench silicidation process). The gate 264 as shown in FIG. 1 can be formed in a similar fashion as the gate 164.

The silicide layer 172 can be formed on the doped region 142 using a trench silicidation process, for example. The silicide layer 176 can likewise be formed on the doped region 146 using a trench silicidation process or another similar type of process. The silicide layer 172 and the silicide layer 176 can generally be formed using a combination of silicon and some type of metal, such as a transition metal, among other possible implementations. The silicide layer 172 can be formed on the doped region 142 to provide an electrical contact for a transistor source terminal. The silicide layer 176 can be formed on the doped region 146 to provide an electrical contact for a transistor drain terminal. The trench silicidation process used to form the silicide layer 172 and the silicide layer 176 can generally include deposition of a metal and heating of the wafer, followed by etching to leave the silicide layer 172 and the silicide layer 176 exposed in the active regions of the semiconductor device 100. The top surfaces (from the perspective shown in FIG. 2) of the doped region 142, the doped region 144, the doped region 146, and the doped region 148 can extend above the top surfaces of the undoped region 141, the undoped region 143, the undoped region 145, the undoped region 147, the undoped region 149, and the undoped region 151. Accordingly, the heights of the doped region 142, the doped region 144, the doped region 146, and the doped region 148 can be greater than the heights of the undoped region 141, the undoped region 143, the undoped region 145, the undoped region 147, the undoped region 149, and the undoped region 151. This structure including the height differences provides a raised source/drain (RSD) structure having advantageous electrical properties for electrostatic discharge prevention.

The interconnect 182 can be disposed on the silicide layer 172 to form a transistor source terminal and provide a connection between the semiconductor device 100 (e.g., FinFET) and one or more additional circuit elements (e.g., other components of an integrated circuit, such as other FinFETs). The interconnect 184 can be disposed on the gate 164 to form a transistor gate terminal and likewise to provide a connection between the semiconductor device 100 and one or more additional circuit elements. As noted, in some examples, a silicide layer similar to the silicide layer 172 and the silicide layer 176 can be formed on the gate 164, and then the interconnect 184 can be formed on that silicide layer. The interconnect 186 can be disposed on the silicide layer 176 to form a transistor drain terminal, and to provide a connection between the semiconductor device 100 and one or more additional circuit elements. As shown, the interconnect 186 does not contact the doped region 144 or the doped region 146 of the fin 140. The interconnect 182, the interconnect 184, and the interconnect 186 can be formed using any suitable interconnect structures and materials. The interconnect 182, the interconnect 184, and the interconnect 186 can be implemented as conductive copper vias, for example, among other possible approaches for implementing the interconnect 182, the interconnect 184, and the interconnect 186. The term "interconnect" as used herein refers to any structure used to form one or more electrical connections between components of the semiconductor device 100, and should not unduly limit the scope of the claims.

The doped region 142, the doped region 144, the doped region 146, and the doped region 148 can each be in-situ doped epitaxial regions on the fin 140. The doped region 142, the doped region 144, the doped region 146, and the doped region 148 can be formed using various suitable doping techniques, including doping of the fin 140 (e.g., a silicon fin) using phosphorus or another suitable dopant. As a result of the doping process (e.g., an ion implantation process, etc.), the doped region 142, the doped region 144, the doped region 146, and the doped region 148 of the fin 140 can exhibit different electrical properties than the undoped region 141, the undoped region 143, the undoped region 145, the undoped region 147, the undoped region 149, and the undoped region 151 of the fin 140. For example, after doping pure silicon with phosphorus, extra valence electrons can be added that become unbounded from individual atoms and allow the doped region 142, the doped region 144, the doped region 146, and the doped region 148 of the fin 140 exhibit properties of electrically conductive semiconductor materials.

As shown in FIG. 2, the doped region 142 can be disposed between the undoped region 141 and the undoped region 143. The doped region 144 can be disposed between the undoped region 145 and the undoped region 147. The doped region 146 can be disposed between the undoped region 147 and the undoped region 149. The doped region 148 can be disposed between the undoped region 149 and the undoped region 151. Moreover, the trench 190 can be disposed between the undoped region 143 and the undoped region 145. The geometric relationship between (i) the doped region 144 and the doped region 146, and (ii) the doped region 148 and the doped region 146, can be generally symmetric to provide an intrinsic ballast resistor at the drain of the semiconductor device 100. That is, a distance between (i) the doped region 144 and the doped region 146, and (ii) the doped region 148 and the doped region 146, can be equal. Accordingly, the length of the undoped region 147 (along the cross section AA') can be equal to the length of the undoped region 149. In this sense, it will be appreciated that the term "equal" does not necessarily mean exactly equal, as manufacturing process variations can introduce some degree of error during fabrication. For example, accounting for process variations, a difference of the distance between the doped region 144 and the doped region 146 and the distance between the doped region 148 and the doped region 146 can be between 1 picometer and 5 nanometers, and a difference of the length of the undoped region 147 and the length of the undoped region 149 can also be between 1 picometer and 5 nanometers.

The generally symmetric relationship of the doped region 144, the doped region 146, and the doped region 148 can provide an intrinsic ballast resistor within the semiconductor device 100. The resistance of the intrinsic ballast resistor can increase as the current flowing through the fin 140 increases, and the resistance of the intrinsic ballast resistor can decrease as the current flowing through the fin 140 decreases. In some examples, the use of silicide layers (e.g., the silicide layer 172 and the silicide layer 176) can cause some unwanted device characteristics, including current crowding at the shallow silicide surface. However, the added intrinsic ballast resistor can mitigate these unwanted characteristics without requiring additional fabrication steps and without requiring the use of additional masks during the fabrication process. In some examples, the human body model (HBM) voltage of the semiconductor device 100 can be improved through the added intrinsic ballast resistor without significantly affecting the breakdown voltage. As a result, the semiconductor device 100 can provide better electrostatic discharge prevention when compared to structures that do not include such an intrinsic ballast resistor.

In some examples, the operating voltage of the semiconductor device 100 can range from range from 1 volt to 15 volts. The height of the fin 140 can range from 35 nanometers to 60 nanometers. The length of the gate 164 (along the direction of the fin 140) can range from 200 nanometers to 1 micrometer (micron). The length of the trench 190 (along the direction of the fin 140) can range from 100 nanometers to 1 micrometer (micron). Under these operating conditions and design parameters, the electrostatic discharge prevention functionality provided by the added intrinsic ballast resistor can be particularly advantageous.

Figure 3:
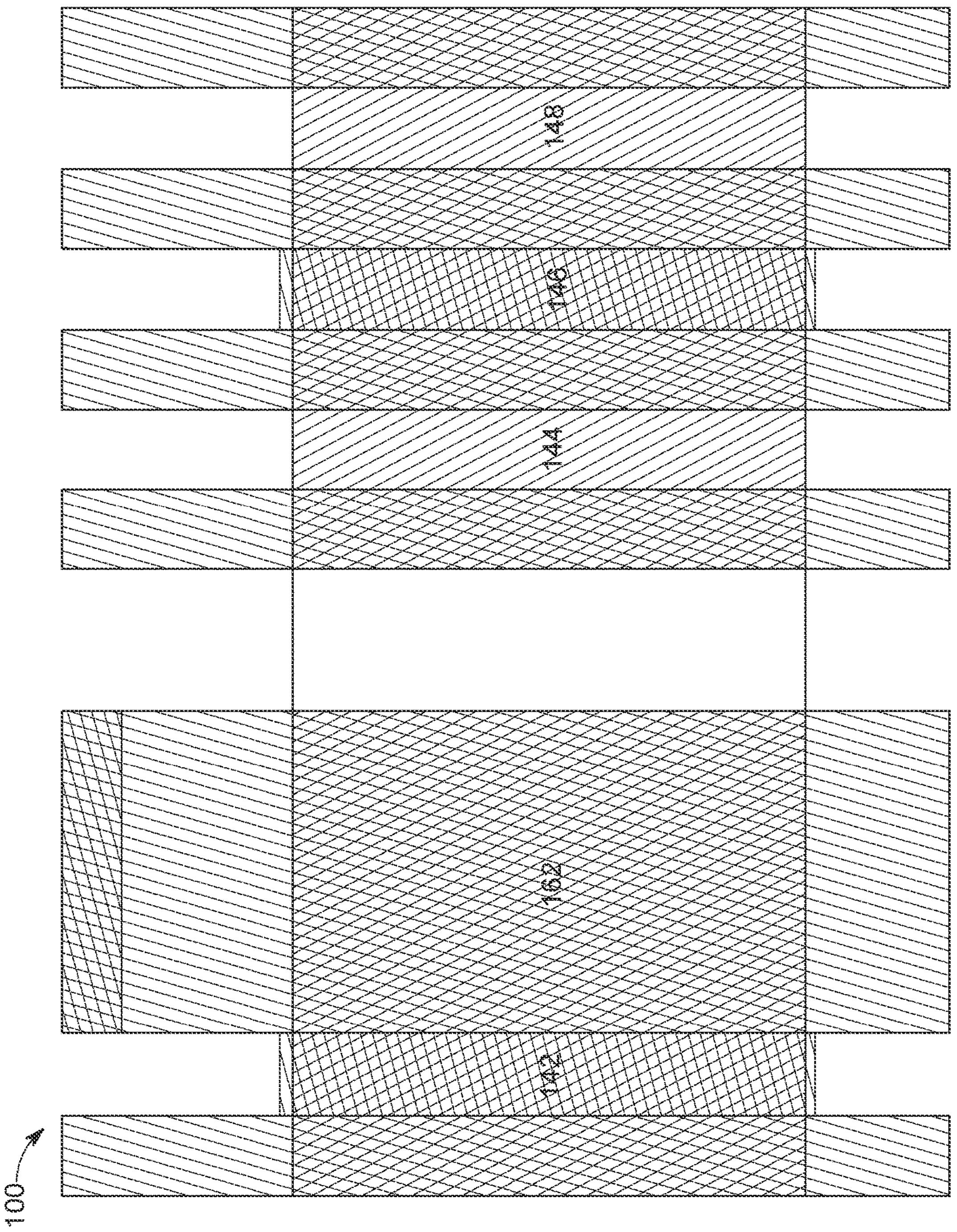
FIG. 3 shows a virtual representation of the example semiconductor device of FIG. 1, in accordance with some aspects of the disclosure.

Referring to FIG. 3, an illustration showing a virtual representation of the semiconductor device 100 is shown, in accordance with some aspects of the disclosure. Each of the doped region 142, the doped region 144, the doped region 146, and the doped region 148 can be seen be seen in FIG. 3. Moreover, the gate 162 can be seen in FIG. 3. As shown, the geometric relationship between (i) the doped region 144 and the doped region 146, and (ii) the doped region 148 and the doped region 146 are generally symmetric to provide an intrinsic ballast resistor at the drain of the semiconductor device 100. That is, the distance between (i) the doped region 144 and the doped region 146, and (ii) the doped region 148 and the doped region 146 can be approximately equal. For example, accounting for process variations, a difference of the distance between the doped region 144 and the doped region 146 and the distance between the doped region 148 and the doped region 146 can be between 1 picometer and 5 nanometers.

The invention claimed is:

1. A semiconductor device, comprising:

a fin disposed on a substrate, the fin defining a channel of the semiconductor device, the fin comprising an undoped region, a first doped region, a second doped region, and a third doped region positioned between the first doped region and the second doped region;

a gate disposed on the undoped region of the fin;

a silicide layer disposed on the third doped region of the fin;

an interconnect disposed on the silicide layer to form a drain;

a fourth doped region;

a second silicide layer disposed on the fourth doped region; and a second interconnect disposed on the second silicide layer to form a source;

wherein the fin comprises a trench that is positioned between the first doped region and the fourth doped region;

wherein the interconnect is not in contact with the first doped region or the second doped region;

wherein the third doped region is disposed on an n-type well of the substrate; and wherein the channel of the semiconductor device extends beneath an isolation structure below the trench.

2. The semiconductor device of claim 1, wherein the first doped region and the second doped region are disposed on the n-type well of the substrate.

3. The semiconductor device of claim 1, wherein a height of the third doped region is greater than a height of the undoped region.

4. The semiconductor device of claim 1, wherein a difference of a distance between the first doped region and the third doped region and a distance between the second doped region and the third doped region is between 1 nanometer and 5 nanometers.

5. The semiconductor device of claim 1, wherein a height of the fin is between 35 nanometers and 60 nanometers.

6. The semiconductor device of claim 1, wherein a length of the gate disposed on the undoped region of the fin is between 200 nanometers and 1 micrometer.

7. The semiconductor device of claim 1, wherein an operating voltage of the semiconductor device is between 1 volt and 15 volts.

8. The semiconductor device of claim 1, wherein a length of the trench positioned between the first doped region and the fourth doped region is between 100 nanometers and 1 micrometer.

9. The semiconductor device of claim 1, wherein the semiconductor device comprises a second gate disposed on a second undoped region of the fin.

10. The semiconductor device of claim 9, wherein the fin comprises a second trench that is positioned between the third doped region and the second undoped region.

11. The semiconductor device of claim 1, wherein:

the fin comprises a second undoped region disposed between the first doped region and the third doped region;

the fin comprises a third undoped region disposed between the second doped region and the third doped region; and a difference of a length of the second undoped region and a length of the third undoped region is between 1 nanometer and 5 nanometers.

12. The semiconductor device of claim 11, wherein the second undoped region and the third undoped region are disposed on the n-type well of the substrate.

13. The semiconductor device of claim 12, wherein the silicide layer is not disposed on the second undoped region or the third undoped region.

14. The semiconductor device of claim 1, wherein the gate is disposed only on the undoped region of the fin.

15. The semiconductor device of claim 1, wherein the fourth doped region is disposed on a p-type well of the substrate.

16. The semiconductor device of claim 15, wherein the fourth doped region directly contacts the p-type well of the substrate.

17. The semiconductor device of claim 1, wherein the third doped region directly contacts the n-type well of the substrate.

18. The semiconductor device of claim 1, wherein the trench is disposed over a shallow trench isolation (STI).

* * * * *